(12) United States Patent
Li et al.

(10) Patent No.: US 9,589,786 B2
(45) Date of Patent: Mar. 7, 2017

(54) METHOD FOR POLISHING A POLYMER SURFACE

(71) Applicant: National Center for Advanced Packaging Co., Ltd., Wuxi, Jiangsu Province (CN)

(72) Inventors: Ting Li, Wuxi (CN); Haiyang Gu, Wuxi (CN)

(73) Assignee: National Center for Advanced Packaging Co., Ltd, Wuxi (CN)

(*) Notice: Subject to any disclaimer, the term of this patent is extended or adjusted under 35 U.S.C. 154(b) by 0 days.

(21) Appl. No.: 14/689,067

(22) Filed: Apr. 17, 2015

(65) Prior Publication Data
US 2015/0311093 A1 Oct. 29, 2015

(30) Foreign Application Priority Data

Apr. 28, 2014 (CN) .......................... 2014 1 0173271
Apr. 28, 2014 (CN) .......................... 2014 1 0174848
Apr. 28, 2014 (CN) .......................... 2014 1 0174849

(51) Int. Cl.
| H01L 21/302 | (2006.01) |
| H01L 21/461 | (2006.01) |
| H01L 21/02 | (2006.01) |
| H01L 21/3105 | (2006.01) |
| H01L 21/321 | (2006.01) |
| H01L 21/56 | (2006.01) |
| H01L 21/768 | (2006.01) |

(52) U.S. Cl.
CPC .. *H01L 21/02065* (2013.01); *H01L 21/02074* (2013.01); *H01L 21/31058* (2013.01); *H01L 21/3212* (2013.01); *H01L 21/56* (2013.01); *H01L 21/7684* (2013.01); *H01L 21/76819* (2013.01)

(58) Field of Classification Search
CPC ......... H01L 21/02065; H01L 21/02118; H01L 21/465
USPC ............................................. 216/38; 438/693
See application file for complete search history.

(56) References Cited

U.S. PATENT DOCUMENTS

| 6,153,525 A * | 11/2000 | Hendricks ......... H01L 21/31053 257/E21.244 |
| 2012/0001262 A1* | 1/2012 | Kang ................ H01L 21/02074 257/368 |

* cited by examiner

*Primary Examiner* — Robert Culbert
(74) *Attorney, Agent, or Firm* — Zareefa B. Flener; Flener IP Law

(57) ABSTRACT

A method for polishing a polymer surface is provided by an embodiment of the present invention. The method includes: curing the polymer surface; polishing the polymer surface cured through a CMP process. By using the method for polishing a polymer surface provided by embodiments of the present invention, the mentioned problems in the prior art are solved. The uniformity of the polymer surface can be improved to <1% through a CMP process, which can meet the requirements of high density and small linewidth integration.

19 Claims, 3 Drawing Sheets the polymer surface is cured; — 101 the polymer surface cured is polished through a CMP process. — 102

METHOD FOR POLISHING A POLYMER SURFACE

CROSS-REFERENCE TO RELATED APPLICATION

This application claims priorities from CN Patent Application Ser. No. 201410174849.0 (filed on Apr. 28, 2014), CN Patent Application Ser. No. 201410174848.6 (filed on Apr. 28, 2014) and CN Patent Application Ser. No. 201410173271.7 (filed on Apr. 28, 2014); the entire contents of which are incorporated herein by reference for all purposes.

FIELD OF THE INVENTION

The present invention is related to manufacturing technology of semiconductor devices, especially related to a method for polishing a polymer surface.

BACKGROUND OF THE INVENTION

In the prior manufacturing technology of semiconductor devices, polymer is usually used to form a dielectric layer in a manufacturing process or a packaging process, and a copper wiring process is implemented on the polymer surface of the dielectric layer. However, the uniformity of the polymer surface is not good, which cannot meet the requirements of high density integration and advanced packaging.

For example, in the prior manufacturing process of an interposer, polymer (e.g. polyimide or BCB) is used to form a substrate. The uniformity of the polymer surface is around +/−10%, and the TTV (total thickness variation) of the 40 um-thickness substrate is around 4 um. A rough polymer surface is unfavorable for following processes including etching, PVD and electroplating. The prior common method to solve this problem is depositing a $SiO_2$ dielectric layer on the substrate through a CVD process; however this method is costly and complicated. Even by spin coating the polymer surface of the substrate, the uniformity of the polymer surface is only roughly improved and still cannot meet the requirement of high density integration.

Damascene technology is widely applied in semiconductor manufacture to form copper wires. A common damascene process includes: forming a dielectric layer on a silicon substrate; etching via-holes on the dielectric layer; forming a barrier layer; and depositing copper in the via-holes. In a prior damascene process used in a TSV interposer process, before depositing copper in the via-holes, copper seed layer is further formed in the hole through a PVD process. Finally, the copper exposed outside the dielectric layer should be removed through a CMP process to form copper wires.

In the prior damascene process, the dielectric layer may be formed through a CVD process. Though the process is reliable and internal holes are easy to be controlled, the CVD process is highly cost. Polymer may also be used to form a dielectric layer. However, the uniformity of the polymer surface is not good, which is only favorable for a large-line-width integration and cannot meet the requirement of high density integration.

RDL technology is also widely applied in semiconductor manufacture. In a prior RDL process, to reduce the cost and simplify the process, the outer dielectric layer is made of polymer (e.g. polyimide or BCB). However, the rough surface of the polymer outer dielectric layer is unfavorable for a multi-layer RDL process and cannot meet the requirements of high density integration. The uniformity of the polymer surface may get worse and worse with the increase of RDL layers. Therefore, only 2~3 layers RDL process could be achieved in the prior art, it is difficult to successfully implement a more than 3 layers RDL process.

SUMMARY OF THE INVENTION

To solve the problems mentioned above, a method for polishing a polymer surface is provided by the present invention, which greatly improves the uniformity of the polymer surface to meet requirements of high density integration and advanced packaging.

According to an embodiment of the present invention, a method for polishing a polymer surface includes:
  curing the polymer surface;
  polishing the polymer surface cured through a CMP process.

By using the method for polishing a polymer surface provided by embodiments of the present invention, the mentioned problems in the prior art are solved. The uniformity of the polymer surface can be improved to <1% through a CMP process, which can meet the requirements of high density and small line width integration.

BRIEF DESCRIPTION OF THE DRAWINGS

To give a further description of the embodiments in the present invention or the prior art, the appended drawings used to describe the embodiments and the prior art will be introduced as follows. Obviously, the appended drawings described here are only used to explain some embodiments of the present invention. Those skilled in the art can understand that other appended drawings may be obtained according to these appended drawings without creative work.

DETAILED DESCRIPTION OF THE INVENTION

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a", "an", and "the" include plural references. The meaning of "in" includes "in" and "on". The term "coupled" implies that the elements may be directly connected together or may be coupled through one or more intervening elements. Further reference may be made to an embodiment where a component is implemented and multiple like or identical components are implemented.

The order of the steps in the present embodiment is exemplary and is not intended to be a limitation on the embodiments of the present invention. It is contemplated that the present invention includes the process being practiced in other orders and/or with intermediary steps and/or processes.

The embodiments of the present invention are described more fully hereinafter with reference to the accompanying drawings, which form a part hereof, and which show, by way of illustration, specific exemplary embodiments by which the invention may be practiced. When illustrating the embodiments of the present invention, the cross-sectional views are exemplary and not enlarged in proportion, which is not intended to be a limitation on the embodiments of the present invention. Besides, three-dimension size having length, width and depth should be involved in practical production.

Figure 1:
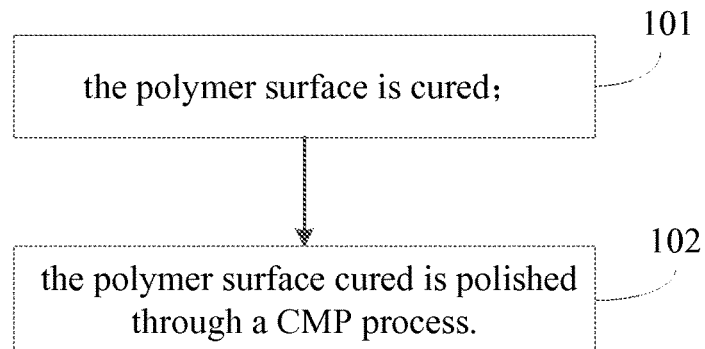
FIG. 1 illustrates a flow chart of a method for polishing a polymer surface in an embodiment of the present invention.

FIG. 1 illustrates the flow chart of a method for polishing a polymer surface in an embodiment of the present invention. As shown in FIG. 1, the process includes following steps.

Step 101: the polymer surface is cured.

By curing the polymer surface, contact angle of the polymer surface is decreased and imidization degree of the polymer surface is improved, so that the polymer surface could be easily hydrolyzed in CMP (Chemical Mechanical Polishing) polishing slurry, which can improve the efficiency of the following CMP process.

In an embodiment of the present invention, the polymer surface is cured by being baked under 150° C.~250° C. for 30 min~60 min. After being cured, contact angle of the polymer surface is less than 70 degree.

Step 102: the polymer surface cured is polished through a CMP process.

Those skilled in the art can understand that, many kinds of functional substrates with different manufacture method and structure may have the same polymer surface. Thus, the method for polishing a polymer surface provided by an embodiment of the present invention could be applied to those functional substrates, however, may be adjusted based on functional substrates. Embodiments are described hereinafter as examples of the adjustment.

In an embodiment of the present invention, the method for polishing a polymer surface is applied in an interposer manufacturing process. The method for polishing the polymer surface includes following steps.

1) In an interposer manufacturing process, polymer (Polyimide or BCB) is spin coated or spray coated on a substrate which is made of polymer or other materials (such as glass, or ceramics) to form a polymer surface. In order to perform a CMP process to achieve a uniform polymer surface, the thickness of the polymer surface should be 10%~15% more than the requirement of the final thickness of the substrate. For example, if a substrate with 40 um thickness is finally required, the thickness of the polymer surface should be around 45 um, herein, the 5 um thickness is used as removal allowance of the polishing process.

2) Before CMP, the polymer surface is cured. In an embodiment, the substrate is baked under 150° C.~250° C. for 30 min~60 min to make contact angle of the polymer surface less than 70 degree, so that the polymer surface could be easily hydrolyzed in CMP (Chemical Mechanical Polishing) polishing slurry, which can improve the efficiency of the following CMP process. In an embodiment, the substrate may be baked under 125° C.~250° C. for 30 min~60 min.

3) A CMP process is implemented on the polymer surface, to make the uniformity of the polymer surface less than 1%.

In an embodiment of the present invention, following consumables are involved in the CMP process:

(a) colloidal slurry including abrasive of $SiO_2$, $CeO_2$ or $Al_2O_3$. Herein, the size of the abrasive may be 5 nm~160 nm; the abrasive content in solution may be 0.01 wt %~20 wt %; PH may be >7; the abrasive shape may include round, sharp angle, or other shapes according to process requirements. Furthermore, the colloidal slurry may include additive (e.g.: glycerol), viscosity range of which is 18~300 mPa·s under 20~80° C.

b) surfactant, being used to increase surface activity of the polymer surface, which may be added into colloidal slurry by the supplier. The surfactant may include: DIW, KOH or THAM.

c) polishing pads which may include a hard pad and a soft pad, and have various groove pattern and groove depth on its surface. Pad hardness of the hard pad is from 50 shore D to 60 shore D and pad hardness of the soft pad is less than 50 shore D. The density range of microcellular polyurethane used in the polishing pads is 0.13 $g/cm^3$~1.6 $g/cm^3$.

In an embodiment of the present invention, the CMP process including following sub-steps:

(1) the polymer surface is polished 2-3 times. Herein, the first polishing and second polishing may be implemented at a time, however, considering the throughput efficiency and uniformity, it is better to implement the first and second polishing processes separately.

a) the polymer surface is roughly polished. The process may be implemented by a first grinding table under a removal rate which is higher than 1 um/min. Furthermore, the head pressure of the grinding table is 3 psi~4 psi, platen and head RPM (revolutions per minutes) is 100 RPM~130 RPM, and the slurry flow rate is 150 ml/min~300 ml/min.

In an embodiment of the present invention, the hard pad may be applied in the roughly polishing process; and a CMP optical end point system for fix thickness polishing may be also applied.

b) the polymer surface is further polished. The process may be implemented by a second grinding table under a lower removal rate which is between 0.5 um/min and 1 um/min. Furthermore, the head pressure of the grinding table is 2 psi~3 psi. In an embodiment, the other parameters may be the same with the first polishing process. In an embodiment, the platen and head RPM may be 80 RPM~110 RPM.

In an embodiment of the present invention, the hard pad may be applied in this polishing process; and a CMP optical end point system for fix thickness polishing may be also applied.

c) the polymer surface is finely polished. The process may be implemented by a third grinding table under a removal rate which is lower than the rate of the further polishing process. Furthermore, the head pressure may be 0.2~2 psi, the platen and head RPM may be 40 RPM~70 RPM. In an embodiment, the platen and head RPM may be 80 RPM~110 RPM.

In an embodiment of the present invention, the soft pad may be applied in the finely polishing process; and a CMP optical end point system for fix thickness polishing may be also applied.

In an embodiment of the present invention, the polymer surface is polished through a 2-steps CMP process. The 2-steps CMP process including following sub-steps:

(a) the polymer surface is roughly polished by a first grinding table under a removal rate which is higher than 1 um/min. The head pressure may be 3 psi~4 psi; the platen and head RPM may be 100 RPM~130 RPM; the slurry flow rate may be 150 ml/min~300 ml/min.

(b) the polymer surface is finely polished by a second grinding table under a removal rate which is lower than 1 um/min. The head pressure may be 0.2~2 psi; the platen and head RPM may be 40 RPM~70 RPM; the slurry flow rate may be 150 ml/min~300 ml/min.

(2) the polymer surface polished is then cleaned. The cleaning process may include following steps.

(a) Big particles are removed by using a Megsonic tank with DIW.

(b) Adhesive particles are removed by using PVA to brush the polymer surface under a special rotation speed in a Chemical tank with proper chemical (such as, CX100, produced by Wako Pure Chemical Industries, Ltd.).

In an embodiment of the present invention, this step may be repeated to further remove adhesive particles.

(c) The polymer surface is dried by using IPA and being rotated under high speed.

The advantage of applying the present invention in an interposer process includes:

firstly, the cost is greatly reduced by replacing silicon substrate with polymer substrate;

second, the uniformity of the polymer surface is improved to <1% (e.g. the thickness variation of the polymer surface of a 10 um substrate is only 0.1 um) through a CMP process, which can meet the requirements of high density and small line width integration;

thirdly, the CMP rate is increased by adjusting polymer material, curing temperature and curing time to low the cost when the CMP rate is influenced by an imidization process.

FIGS. 2a~2e illustrate the flow diagram of a method for polishing a polymer surface in a damascene process.

Figure 2A:
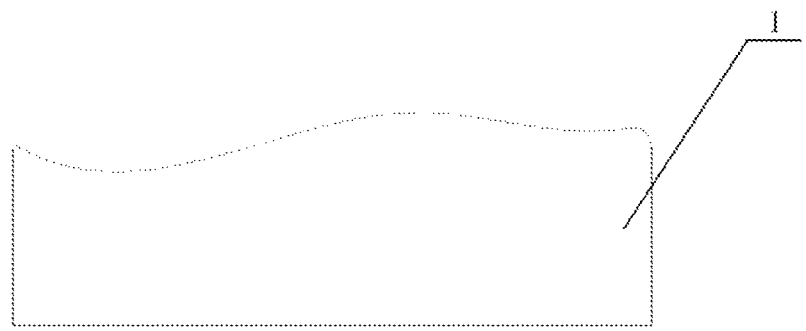
FIGS. 2a~2e illustrate a flow diagram of a method for polishing a polymer surface in a damascene process.

In a damascene process, polymer is spin coated on a substrate which is made of silicon or other materials to form polymer surface. The polymer surface of the substrate is not uniform, as shown in FIG. 2a. A 3-steps CMP process is provided by the present invention to improve the uniformity of the polymer surface. Firstly, copper slurry is used to remove copper on the surface of the substrate; secondly, barrier slurry is used to remove a barrier layer; thirdly, colloidal slurry including addictive agent is used to polish the polymer surface. The detail damascene process including the 3-steps CMP process is described as follows.

Step 201: the polymer surface is cured by being baked. Herein, The baking temperature may be 150° C.~250° C. and baking time may be 30 min~60 min. Contact angle of the polymer surface cured should be less than 70 degree. Under this process condition, imidization degree of polymer is good, so that the polymer surface can be easily hydrolyzed in CMP slurry, which can improve the efficiency of the following CMP process.

Figure 2B:
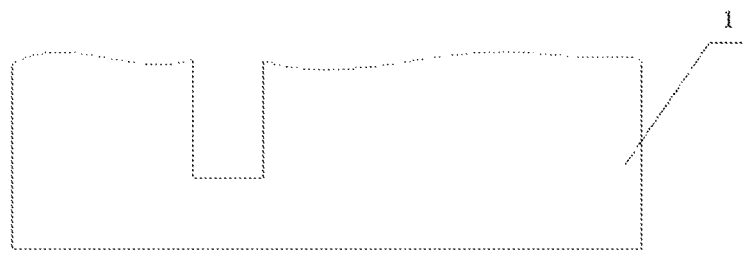

Step 202: a hole is etched on the polymer surface, as shown in FIG. 2b.

Figure 2C:
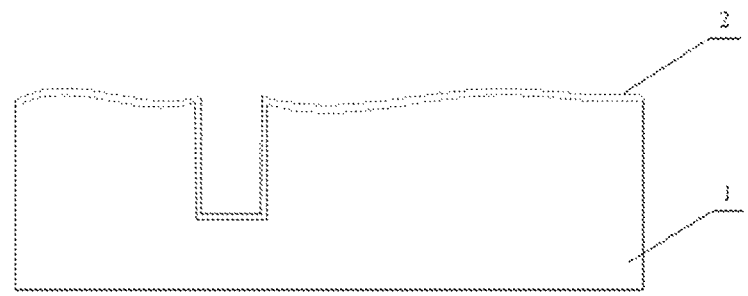

Step 203: a barrier layer 2 is formed on the polymer surface and in the hole, as shown in FIG. 2c. The barrier layer is used for preventing copper electro-migration and increasing adhesion between copper and polymer. The barrier layer can also be used in a CMP optical end point system for fix thickness polishing. In an embodiment of the present invention, the barrier layer may be made of PECVD silicon nitride, or PECVD silicon dioxide, or Titan, or tantalum and so on.

Figure 2D:
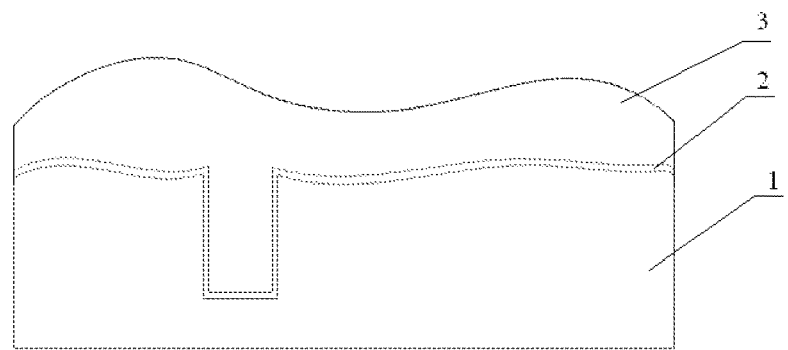

Step 204: a copper seed layer is formed on the polymer surface and in the hole, and copper is deposited on the copper seed layer by electronic plating. The copper seed layer and the copper deposited constitute copper overburden 3 on the barrier layer 2, as shown in FIG. 2d.

Figure 2E:
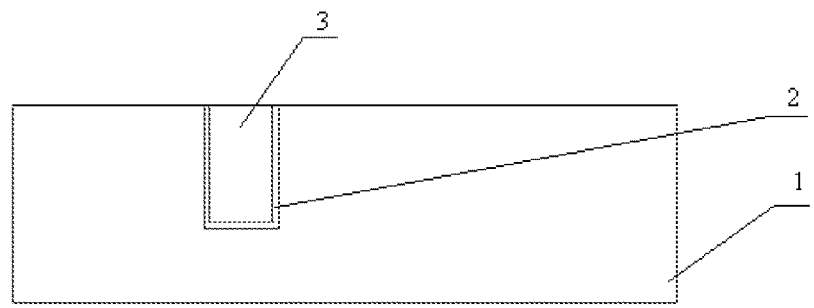

Step 205: a 3-steps CMP process is implemented on the polymer surface, and the final polymer surface is shown in FIG. 2e. The 3-steps CMP process includes:

Step 2051: copper overburden 3 is removed through a CMP process, and the CMP process stops at the barrier layer. The copper overburden 3 removed includes the copper deposited by electronic plating and the copper seed layer. In an embodiment of the present invention, following consumables are involved:

(a) TSV copper slurry, removal rate of which may be >=1 um/min and selectivity (copper:polymer) of which may be more than 200:1. The abrasive of the TSV copper slurry may use any of $SiO_2$, $CeO_2$ or $Al_2O_3$; PH may be 3~7; abrasive size may be 5 nm~160 nm; abrasive shape may include round, sharp angle, or other shapes according to process requirements; abrasive hardness may be within 30 shore D~90 shore D; abrasive percentage may be within 0.01 wt %~20 wt %.

(b) polishing pad. The groove pattern of the polishing pad may be designed according to process requirements; the groove depth range may be 2 mils~200 mils; the pad hardness may be more than 50 shore D; the density range of microcellular polyurethane used in the polishing pad may be 0.13 g/cm³~1.6 g/cm³.

(c) an EPD (endpoint detection) process, a real time process control (RTPC) process and a fullscan process may be applied.

Step 2052: the barrier layer is removed through a CMP process, and the polishing process stops at the polymer surface. In an embodiment of the present invention, following consumables are involved:

(a) barrier slurry, removal rate of which may be >500 Å/min and selectivity (copper:polymer) of which may be <3:1. The abrasive of the barrier slurry may use any of $SiO_2$, $CeO_2$ or $Al_2O_3$; the abrasive size may be 5 nm~160 nm; the abrasive shape may include round, sharp angle, or other shapes according to process requirements; the abrasive hardness may be 30 shore D~90 shore D; the abrasive percentage may be within 0.01 wt %~20 wt %.

(b) polishing pad. The groove pattern of the polishing pad may be designed according to process requirements; the groove depth range may be 2 mils~200 mils; the pad hardness may be more than 50 shore D; the density range of microcellular polyurethane used in the polishing pad may be 0.13 g/cm³~1.6 g/cm³.

(c) an EPD (endpoint detection) process, and a fullscan process may be applied.

Step 2053: the polymer surface is polished through a CMP process to achieve a uniform surface desired. WIWNU (within wafer uniformity) of the polymer surface desired should be less than 1%. In an embodiment of the present invention, following consumables are involved:

(a) colloidal slurry, removal rate of which may be >100 nm/min and selectivity (copper:polymer) of which may be approaching to 1:1. The abrasive of the colloidal slurry may use any of $SiO_2$, $CeO_2$ or $Al_2O_3$; PH may be 7~10; the abrasive size may be 5 nm~160 nm; the abrasive shape may include round, sharp angle, or other shapes according to process requirements; the abrasive hardness may be within 30 shore D~90 shore D; the abrasive percentage may be within 0.01 wt %~20 wt %. Furthermore, the colloidal slurry may include sticky additive (e.g.: glycerol), viscosity range of which is 18~300 mPa·s under 20~80° C.

(b) surfactant, such as DIW, KOH or THAM, may be included in the colloidal slurry to increase the surface activity.

(c) polishing pad. The groove pattern of the polishing pad may be designed according to process requirements; the groove depth range may be 2 mils~200 mils; the pad hardness may be 40 shore D~50 shore D; the density range of microcellular polyurethane used in the polishing pad may be 0.13 g/cm$^3$~1.6 g/cm$^3$.

At last, in an embodiment of the present invention, the polymer surface polished is then cleaned. The cleaning process may include following steps.

(1) Big particles are removed by using a Megsonic tank with DIW (deionized water).

(2) Adhesive particles are removed by using PVA (Polyvinyl Alcohol) to brush the polymer surface under a special rotation speed in a Chemical tank with proper chemical (such as, CX100, SC1, SC2).

(3) Step(2) is repeated in another tank to further remove adhesive particles. In an embodiment of the present invention, the Chemical tanks applied to remove adhesive particles may be used in a specific order according to the chemicals in them. For example, the polymer surface may be firstly brushed in a Chemical tank with CX100, and then a Chemical tank with SC1 is secondly used, and a Chemical tank with SC2 is finally used. However, the order of using Chemical tanks cannot be used to limit the protection scope of the present invention.

(4) The polymer surface is dried by using IPA (isopropyl alcohol) and being rotated in high speed.

The finally cleaned polymer surface is shown in FIG. 2e.

The advantage of applying the present invention in a damascene process includes:

firstly, the cost is greatly reduced by replacing CVD (Chemical Vapor Deposition) by polymer to form as the dielectric layer; the process is easily under control and can be used in various semiconductor products;

secondly, the uniformity of the polymer surface is improved through a CMP process, which can meet the requirements of high density and small linewidth integration.

FIGS. 3a~3d illustrate the flow diagram of a method for polishing a polymer surface in a RDL (re-distribution layer) process. As shown in FIG. 3a~3d, the RDL process include following steps.

Figure 3A:
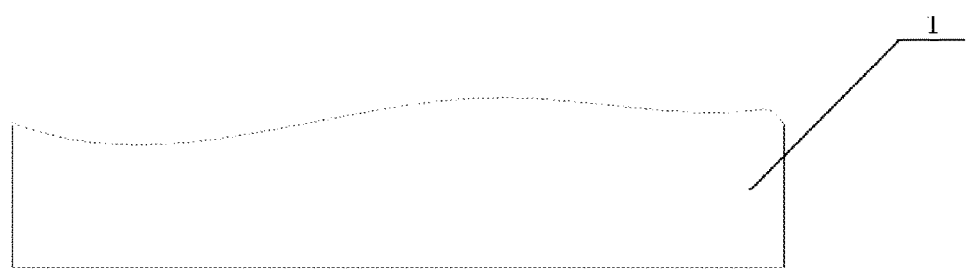
FIGS. 3a~3d illustrate a flow diagram of a method for polishing a polymer surface in a re-distribution layer (RDL) process.

Step 301: an inner dielectric layer is formed by coating polymer (polyimide or BCB) on the substrate 1. As shown in FIG. 3a, the uniformity of the inner dielectric layer is quite low, which is bad for small CD (critical dimension) and high density integration.

Figure 3B:
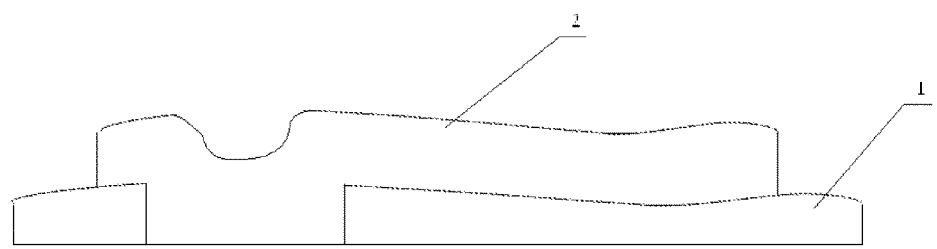

Step 302: a hole is etched on the inner dielectric layer; a copper seed layer is formed by PVD (Physical vapor deposition) on the surface of the inner dielectric layer and in the hole; then a copper wire layer 2 is formed by ECP (electronically copper plating) on the surface of the copper seed layer. However, as shown in FIG. 3b, since the copper depositing processes during the PVD or ECP are isotropic, the uniformity of the substrate after the PVD and ECP is getting rough, especially dim topography may be formed in the fields of the hole.

Figure 3C:
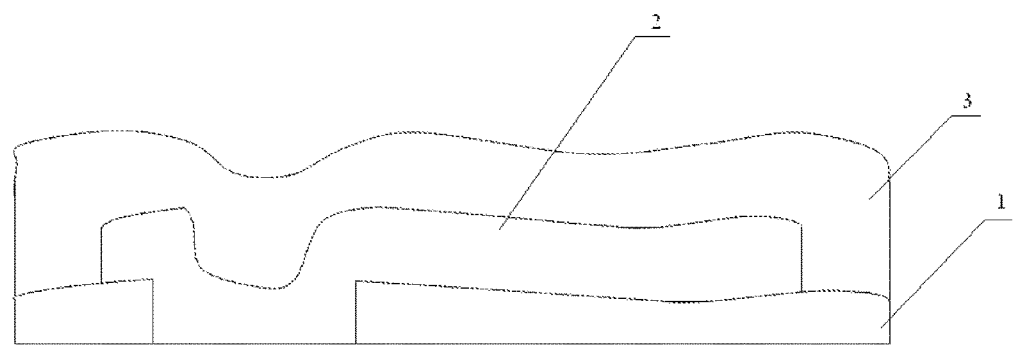
Figure 3D:
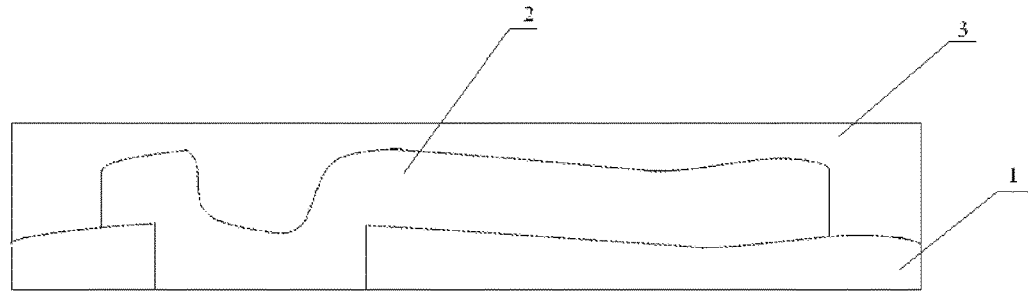

Step 303: an outer dielectric layer 3 is formed by coating polymer (polyimide or BCB) on the copper wire layer 2. As shown in FIG. 3c, the uniformity of the outer dielectric layer 3 is getting even worse based on the surface of the substrate after the PVD and ECP, which is unfavorable for the following processes. In order to perform a CMP process to improve the uniformity of the outer dielectric layer, the thinnest part of the outer dielectric layer should be 30% thicker than the thickest part of the copper wire layer.

Step 304: the outer dielectric layer 3 is cured by being baked under 150° C.~250° C. for 30 min~60 min. Contact angle of the polymer surface cured should be less than 70 degree. Under this process condition, imidization degree of polymer is good, so that the polymer surface can be easily hydrolyzed in CMP slurry, which can improve the efficiency of the following CMP process.

Step 305: a CMP process is implemented on the outer dielectric layer 3. The uniformity of the outer dielectric layer 3 polished should be less than 1%. The outer dielectric layer 3 may be polished 2-3 times. Herein, the first polishing and second polishing may be implemented at a time; however, considering the throughput efficiency and uniformity, it is better to implement those polishing processes separately.

In an embodiment of the present invention, following consumables are involved in the CMP process:

(a) colloidal slurry including: abrasive of $SiO_2$, $CeO_2$ or $Al_2O_3$. Herein, the size of the abrasive may be 5 nm~160 nm; the abrasive content in solution may be 0.01 wt %~20 wt %; PH may be >7; the abrasive shape may include round, sharp angle, or other shapes according to process requirements. Furthermore, the colloidal slurry may include additive (e.g.: glycerol), viscosity range of which is 18~300 mPa·s under 20~80° C.; and may have a removal rate of more than 500 nm/min.

b) surfactant, being used to increase surface activity of the polymer surface, which may be added into colloidal slurry by the supplier. The surfactant may include: DIW, KOH or THAM.

c) polishing pads which may include a hard pad and a soft pad, and have various groove pattern and groove depth on its surface. Pad hardness of the hard pad is from 50 shore D to 60 shore D and pad hardness of the soft pad is less than 50 shore D. The density range of microcellular polyurethane used in the polishing pads is 0.13 g/cm$^3$~1.6 g/cm$^3$.

In an embodiment of the present invention, the CMP process including following sub-steps:

(1) the outer dielectric layer 3 is polished 3 times.

a), the outer dielectric layer 3 is roughly polished. The process may be implemented by a first grinding table under a removal rate which is higher than 1 um/min. Furthermore, the head pressure of the grinding table is 3 psi~4 psi, platen and head RPM (revolutions per minutes) is 100 RPM~130 RPM, and the slurry flow rate is 150 ml/min~300 ml/min.

In an embodiment of the present invention, the hard pad may be applied in the roughly polishing process; and a CMP optical end point system for fix thickness polishing may be also applied.

b), the outer dielectric layer 3 is further polished. The process may be implemented by a second grinding table under a removal rate which is lower than 1 um/min. Furthermore, the head pressure of the grinding table is 2 psi~3 psi. In an embodiment, the other parameters may be the same with the first polishing process. In an embodiment, the platen and head RPM may be 80 RPM~110 RPM.

In an embodiment of the present invention, the hard pad may be applied in this polishing process; and a CMP optical end point system for fix thickness polishing may be also applied.

c), the outer dielectric layer 3 is finely polished. The process may be implemented by a third grinding table under a removal rate which is lower than the rate of the further polishing process. Furthermore, the head pressure may be 0.2~2 psi, the platen and head RPM may be 40 RPM~70 RPM. In an embodiment, the platen and head RPM may be 80 RPM~110 RPM.

In an embodiment of the present invention, the soft pad may be applied in the finely polishing process; and a CMP optical end point system for fix thickness polishing may be also applied.

In an embodiment of the present invention, the polymer surface is polished through a 2-steps CMP process. The 2-steps CMP process including following sub-steps:

(a) The outer dielectric layer 3 is roughly polished by a first grinding table under a removal rate which is higher than 1 um/min. The head pressure may be 3 psi~4 psi; the platen and head RPM may be 100 RPM~130 RPM; the slurry flow rate may be 150 ml/min~300 ml/min.

(b) The outer dielectric layer 3 is finely polished by a second grinding table under a removal rate which is lower than 1 um/min. The head pressure may be 0.2~2 psi; the platen and head RPM may be 40 RPM~70 RPM; the slurry flow rate may be 150 ml/min~300 ml/min.

(2) The outer dielectric layer 3 polished is then cleaned. The cleaning process may include following steps.

(a) Big particles are removed by using a Megsonic tank with DIW.

(b) Adhesive particles are removed by using PVA to brush the polymer surface under a special rotation speed in a Chemical tank with proper chemical (such as, CX100, produced by Wako Pure Chemical Industries, Ltd.).

In an embodiment of the present invention, this step may be repeated to further remove adhesive particles.

(c) The polymer surface is dried by using IPA and being rotated under high speed.

The advantage of applying the present invention in a RDL process includes:

firstly, comparing with a prior damascene process, the cost is lower by using polymer to form as the dielectric layer in a RDL process;

secondly, the uniformity of the polymer outer dielectric layer is improved through a CMP process, which is favorable for a multi-layer RDL process and can meet the requirements of high density and small line width integration.

The above contents are the descriptions of the preferred embodiments of the present invention, which cannot be used to limit the protection scope of the present invention. Under the principle and the novel feature of the present invention, any modifying, equivalent replacement, improvement, etc. are all considered to be within the protection scope of the present invention.

The invention claimed is:

1. A method for polishing a polymer surface, comprising:
curing the polymer surface;
polishing the polymer surface cured through a CMP process;
wherein the CMP process comprises:
implementing a roughly polishing process on the polymer surface; wherein, the removal rate of the roughly polishing process is >1 um/min; and
implementing a finely polishing process on the polymer surface; wherein, the removal rate of the finely polishing process is lower than 1 um/min.

2. The method of claim 1, wherein, contact angle of the polymer surface cured is less than 70 degree.

3. The method of claim 1, wherein, curing the polymer surface comprises:

baking the polymer surface under 150° C.~250° C. for 30 min~60 min.

4. The method of claim 1, wherein, after implementing a roughly polishing process on the polymer surface, and before implementing a finely polishing process on the polymer surface, the CMP process further comprises:
implementing a further polishing process on the polymer surface, wherein, the removal rate of the further polishing process is between 0.5 um/min and 1 um/min;
wherein, the removal rate of the finely polishing process is slower than that of the further polishing process.

5. The method of claim 1, wherein, in the roughly polishing process, the head pressure applied is within 3 psi~4 psi; the platen and head RPM is within 100 RPM~130 RPM; the slurry flow rate is within 150 ml/min 300 ml/min;
in the finely polishing process, the head pressure applied is within 0.2 psi~2 psi; the platen and head RPM is within 40 RPM~70 RPM; the slurry flow rate is within 150 ml/min~300 ml/min.

6. The method of claim 4, wherein, in the further polishing process, the head pressure applied is within 2 psi~3 psi; the platen and head RPM is within 100 RPM~130 RPM; the slurry flow rate is within 150 ml/min~300 ml/min.

7. The method of claim 4, wherein, the platen and head RPM applied in the further polishing process and/or the finely polishing process is 80 RPM~110 RPM.

8. The method of claim 1, wherein, colloidal slurry is applied in the CMP process; wherein, abrasive used in the colloidal slurry comprises any one or any combination of: $SiO_2$, $CeO_2$ and $Al_2O_3$; the size of the abrasive is within 5 nm~160 nm; the abrasive content in solution is within 0.01 wt %~20 wt %; PH is >7; the abrasive shape comprises any one or any combination of round, sharp angle, and other shapes according to process requirements; the colloidal slurry comprises additive, viscosity range of which is 18~300 mPa·s under 20° C.~80° C.

9. The method of claim 8, wherein, the additive comprises glycerol.

10. The method of claim 8, wherein, the colloidal slurry further comprises surfactant.

11. The method of claim 10, wherein, the surfactant comprises any one or any combination of DIW, KOH and THAM.

12. The method of claim 1, wherein a hard pad and a soft pad are applied in CMP process;
wherein, the hard pad, pad hardness of which is 50 shore D~60 shore D, is applied in the roughly polishing process; and
the soft pad, pad hardness of which is less than 50 Shore D, is applied in the finely polishing process.

13. The method of claim 12, wherein, the groove pattern and groove depth of the hard/soft polishing pad is designed according to process requirements.

14. The method of claim 12, wherein, the density range of microcellular polyurethane used in the hard/soft polishing pad is 0.13 g/cm$^3$~1.6 g/cm$^3$.

15. The method of claim 1, wherein, a CMP optical end point system is applied in the CMP process for fix thickness polishing.

16. The method of claim 1, wherein, the polymer surface is made of polyimide or BCB.

17. The method of claim 1, further comprising:
cleaning the polymer surface.

18. The method of claim 17, wherein, cleaning the polymer surface comprises:
removing big particles by using a Megsonic tank with DIW;

removing adhesive particles by using PVA to brush the polymer surface under a special rotation speed in a chemical tank;

repeating the step of removing adhesive particles in another chemical tank;

drying the polymer surface by using IPA and rotating the polymer surface in high speed.

19. The method of claim 18, wherein, the chemical applied in the chemical tank comprises any one of CX100, SC1, and SC2.

* * * * *